United States Patent
Lin et al.

(10) Patent No.: US 10,269,778 B2
(45) Date of Patent: *Apr. 23, 2019

(54) PACKAGE ON PACKAGE (POP) BONDING STRUCTURES

(71) Applicant: Taiwan Semiconductor Manufacturing Company, Ltd., Hsinchu (TW)

(72) Inventors: Jing-Cheng Lin, Hsinchu (TW); Jui-Pin Hung, Hsinchu (TW); Po-Hao Tsai, Zhongli (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/615,274

(22) Filed: Jun. 6, 2017

(65) Prior Publication Data

US 2017/0271311 A1    Sep. 21, 2017

Related U.S. Application Data

(63) Continuation of application No. 15/178,265, filed on Jun. 9, 2016, now Pat. No. 9,673,181, which is a (Continued)

(51) Int. Cl.
*H01L 25/10*    (2006.01)
*H01L 21/56*    (2006.01)
(Continued)

(52) U.S. Cl.
CPC .......... *H01L 25/105* (2013.01); *H01L 21/486* (2013.01); *H01L 21/4853* (2013.01);
(Continued)

(58) Field of Classification Search
CPC ... H01L 25/105; H01L 25/50; H01L 23/3114; H01L 23/49816; H01L 23/49827;
(Continued)

(56) References Cited

U.S. PATENT DOCUMENTS 6,812,066 B2    11/2004    Taniguchi et al.
6,847,109 B2 *   1/2005    Shim .................... H01L 21/561
                                                                257/697
(Continued)

FOREIGN PATENT DOCUMENTS

CN    1790651 A    6/2006
KR    20110068935 A    6/2011
TW    201131696 A    9/2011

*Primary Examiner* — Peniel M Gumedzoe
(74) *Attorney, Agent, or Firm* — Slater Matsil, LLP

(57) ABSTRACT

Various embodiments of mechanisms for forming through package vias (TPVs) with multiple conductive layers and/or recesses in a die package and a package on package (PoP) device with bonding structures utilizing the TPVs are provided. One of the multiple conductive layers acts as a protective layer of the main conductive layer of the TPVs. The protective layer is less likely to oxidize and also has a slower formation rate of intermetallic compound (IMC) when exposed to solder. The recesses in TPVs of a die package are filled by solder from the other die package and the IMC layer formed is below the surface of TPVs, which strengthen the bonding structures.

20 Claims, 14 Drawing Sheets

Related U.S. Application Data continuation of application No. 13/906,043, filed on May 30, 2013, now Pat. No. 9,368,438.

(60) Provisional application No. 61/746,967, filed on Dec. 28, 2012.

(51) Int. Cl.
| | | |
|---|---|---|
| *H01L 25/00* | (2006.01) | |
| *H01L 23/498* | (2006.01) | |
| *H01L 23/538* | (2006.01) | |
| *H01L 23/00* | (2006.01) | |
| *H01L 21/48* | (2006.01) | |
| *H01L 23/31* | (2006.01) | |

(52) U.S. Cl.
CPC ........ *H01L 21/563* (2013.01); *H01L 23/3114* (2013.01); *H01L 23/49816* (2013.01); *H01L 23/49827* (2013.01); *H01L 23/5384* (2013.01); *H01L 23/5389* (2013.01); *H01L 24/24* (2013.01); *H01L 24/82* (2013.01); *H01L 24/97* (2013.01); *H01L 25/50* (2013.01); *H01L 24/73* (2013.01); *H01L 2224/0401* (2013.01); *H01L 2224/04105* (2013.01); *H01L 2224/12105* (2013.01); *H01L 2224/16225* (2013.01); *H01L 2224/32145* (2013.01); *H01L 2224/32225* (2013.01); *H01L 2224/48227* (2013.01); *H01L 2224/73265* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/12042* (2013.01); *H01L 2924/1305* (2013.01); *H01L 2924/1306* (2013.01); *H01L 2924/13091* (2013.01); *H01L 2924/15311* (2013.01); *H01L 2924/181* (2013.01); *H01L 2924/18162* (2013.01)

(58) Field of Classification Search
CPC . H01L 23/5384; H01L 23/389; H01L 21/486; H01L 21/4853; H01L 21/563; H01L 24/24; H01L 24/82; H01L 24/97; H01L 24/73

See application file for complete search history.

(56) References Cited

U.S. PATENT DOCUMENTS

| | | | |
|---|---|---|---|
| 2003/0137045 | A1 | 7/2003 | Sugaya et al. |
| 2006/0121718 | A1 | 6/2006 | Machida et al. |
| 2007/0059862 | A1 | 3/2007 | Eng et al. |
| 2007/0096292 | A1 | 5/2007 | Machida |
| 2007/0164457 | A1 | 7/2007 | Yamaguchi et al. |
| 2008/0217792 | A1 | 9/2008 | Onodera et al. |
| 2009/0246909 | A1 | 10/2009 | Takeuchi et al. |
| 2009/0302445 | A1* | 12/2009 | Pagaila ............... H01L 23/3121 257/678 |
| 2009/0302478 | A1* | 12/2009 | Pagaila ................. H01L 21/568 257/774 |
| 2010/0237495 | A1 | 9/2010 | Pagaila et al. |
| 2010/0289126 | A1* | 11/2010 | Pagaila ............. H01L 23/49822 257/659 |
| 2011/0024915 | A1 | 2/2011 | Brunnbauer et al. |
| 2011/0140259 | A1 | 6/2011 | Cho et al. |
| 2011/0227209 | A1* | 9/2011 | Yoon ................... H01L 23/3128 257/686 |
| 2011/0285023 | A1 | 11/2011 | Shen et al. |
| 2012/0161315 | A1* | 6/2012 | Lin ................... H01L 23/49816 257/738 |
| 2012/0273960 | A1* | 11/2012 | Park .................... H01L 21/4846 257/774 |
| 2013/0134582 | A1 | 5/2013 | Yu et al. |
| 2013/0168848 | A1 | 7/2013 | Lin et al. |
| 2014/0057394 | A1* | 2/2014 | Ramasamy ........... H01L 21/561 438/113 |
| 2014/0124937 | A1* | 5/2014 | Wu ........................ H01L 24/81 257/772 |

\* cited by examiner

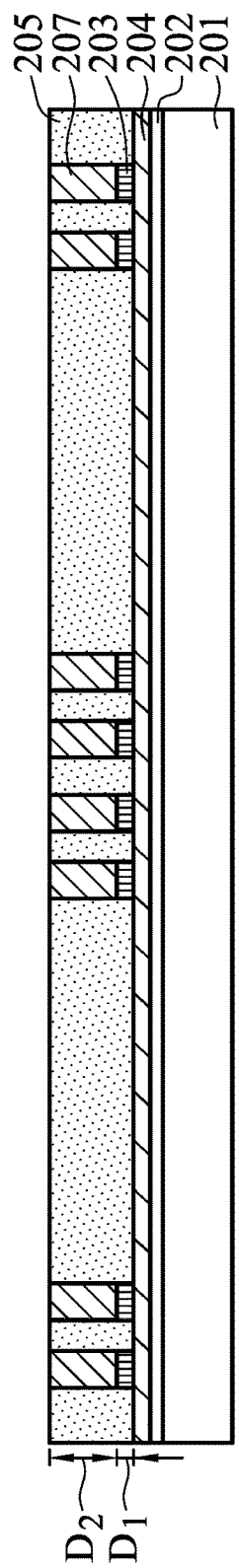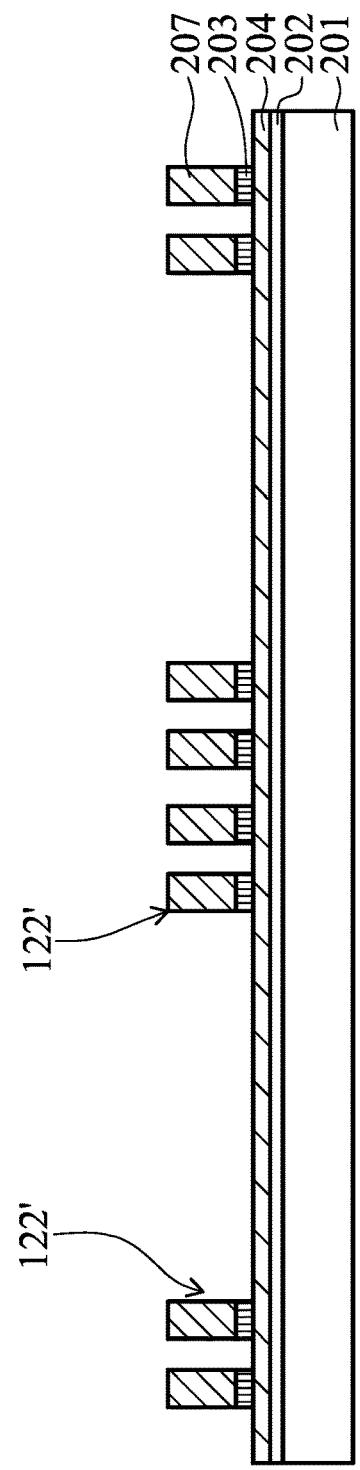

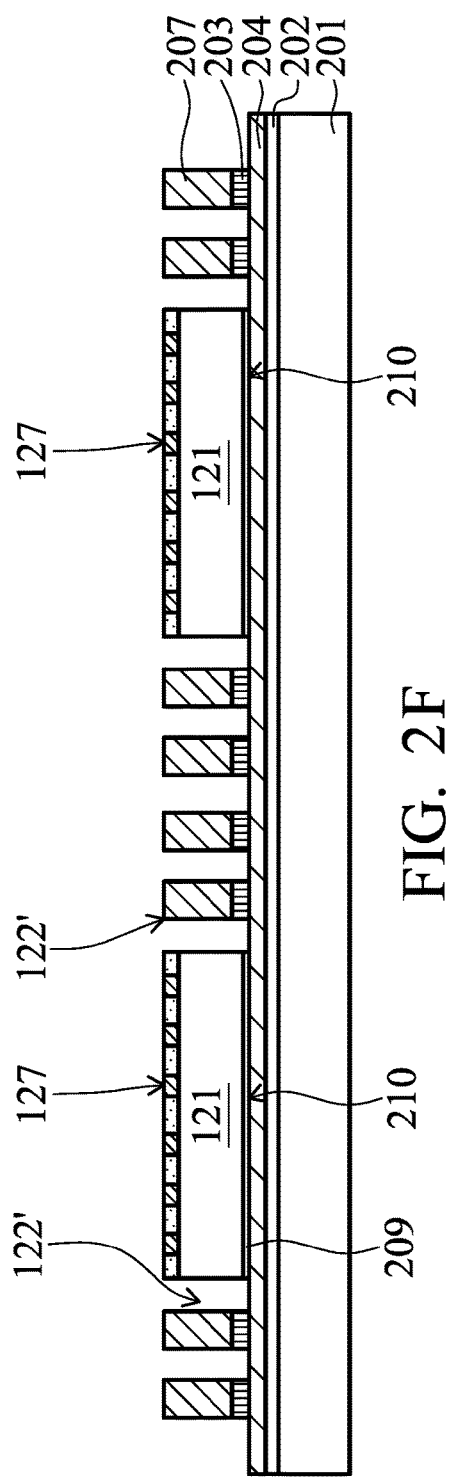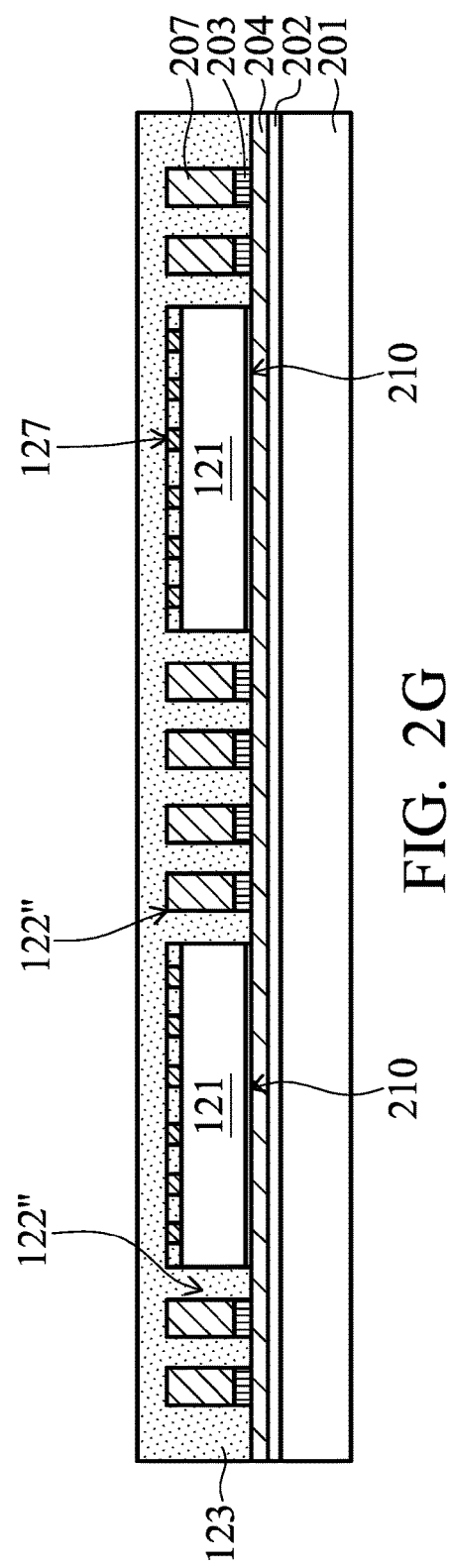

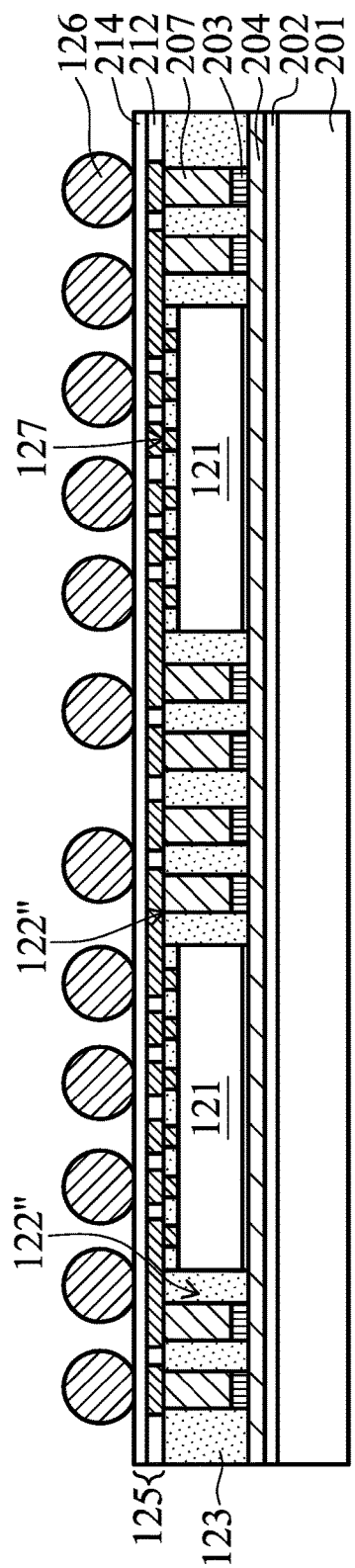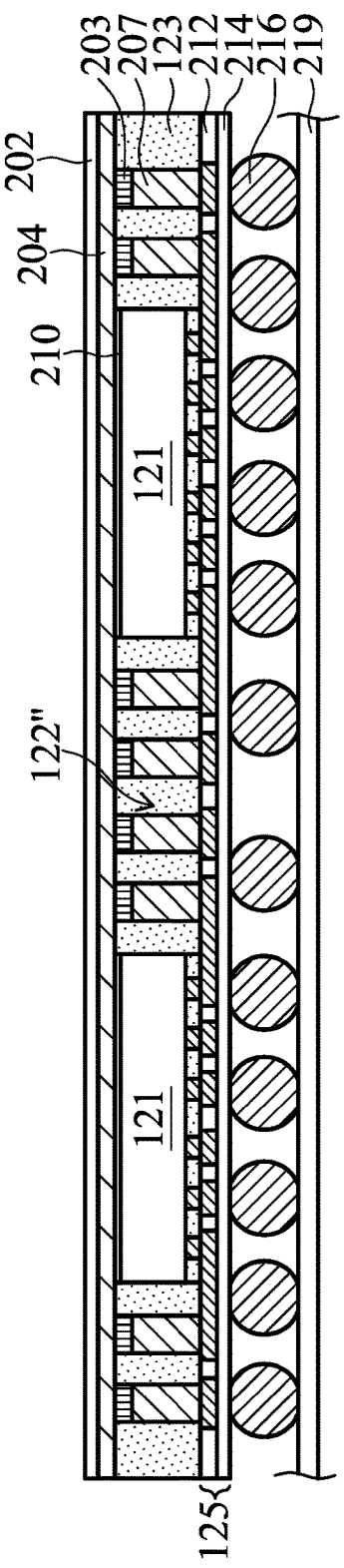
FIG. 2J
FIG. 2K

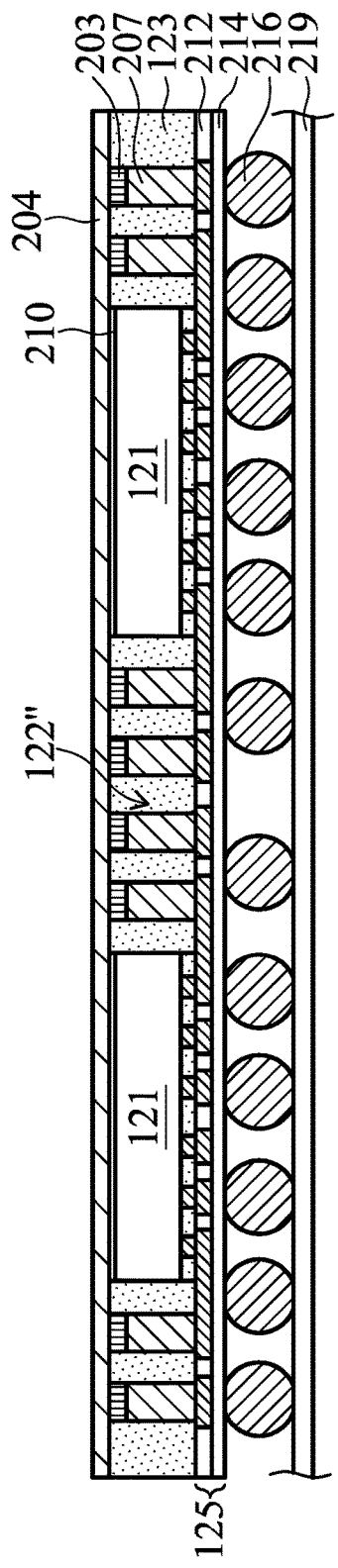
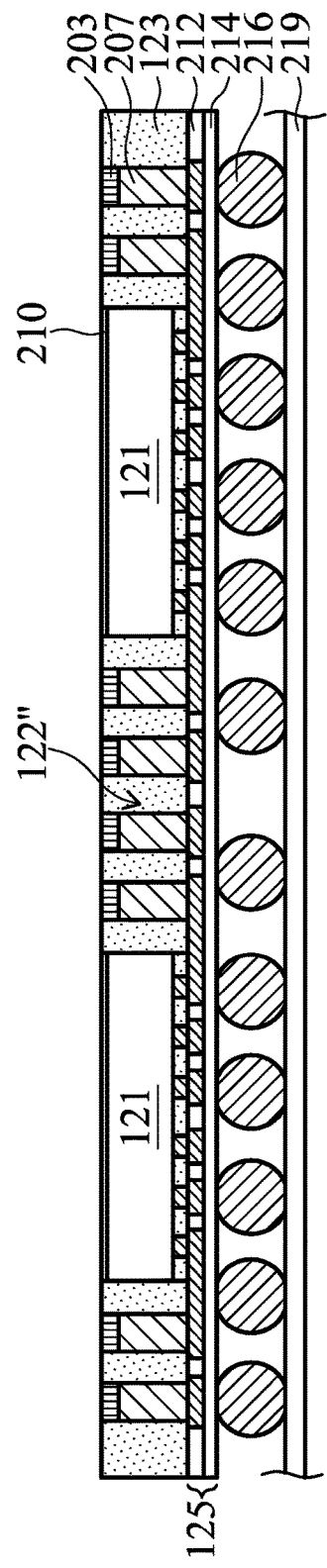
FIG. 2L
FIG. 2M

PACKAGE ON PACKAGE (POP) BONDING STRUCTURES

PRIORITY CLAIM AND CROSS-REFERENCE

This application is a continuation of U.S. patent application Ser. No. 15/178,265, filed on Jun. 9, 2016, and entitled "Package on Package (PoP) Bonding Structures", which is a continuation of U.S. patent application Ser. No. 13/906,043, filed on May 30, 2013, (now U.S. Pat. No. 9,368,438, issued Jun. 14, 2016) and entitled "Package on Package (PoP) Bonding Structures" which claims the benefit of U.S. Provisional Application Ser. No. 61/746,967, filed on Dec. 28, 2012, entitled "Package on Package (PoP) Bonding Structures," which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area and/or lower height than packages of the past, in some applications.

Thus, new packaging technologies, such as package on package (PoP), have begun to be developed, in which a top package with a device die is bonded to a bottom package with another device die. By adopting the new packaging technologies, the integration levels of the packages may be increased. These relatively new types of packaging technologies for semiconductors face manufacturing challenges.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Since the invention of the integrated circuit, the semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limits to the density that can be achieved in two dimensions. One of these limits is the minimum size needed to make these components. Also, when more devices are put into one chip, more complex designs are required.

Three-dimensional integrated circuits (3D ICs) have been therefore created to resolve the above-discussed limitations. In some formation processes of 3D ICs, two or more wafers, each including an integrated circuit, are formed. The wafers are sawed to form dies. Dies with different devices are packaged and are then bonded with the devices aligned. Through-package-vias (TPVs), also referred to as through-molding-vias (TMVs), are increasingly used as a way of implementing 3D ICs. TPVs are often used in 3D ICs and stacked dies to provide electrical connections and/or to assist in heat dissipation.

Figure 1A:
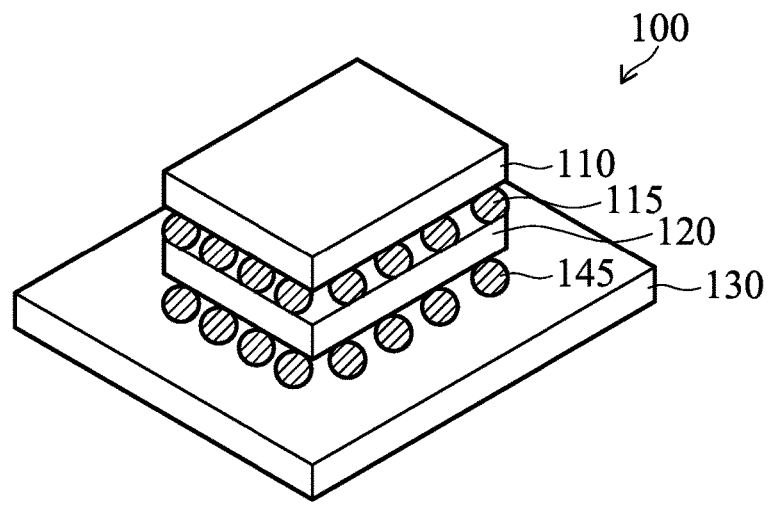
FIG. 1A is a perspective view of a package structure, in accordance with some embodiments.

FIG. 1A is a perspective view of a package structure 100 including a package 110 bonded to another package 120, which is further bonded to another substrate 130 in accordance with some embodiments. Each of die packages 110 and 120 includes at least a semiconductor die (not shown). The semiconductor die includes a semiconductor substrate as employed in a semiconductor integrated circuit fabrication, and integrated circuits may be formed therein and/or thereupon. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices. Package 120 includes through-package-vias (TPVs) and functions as an interposer, in accordance with some embodiments.

Substrate 130 may be made of bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals. In some embodiments, substrate 130 is a multiple-layer circuit board. Package 110 is bonded to package 120 via connectors 115, and package 120 is bonded to substrate 130 via external connectors 145. In some embodiments, the external connectors 145 are bonded bump structures, such as bonded solder bumps, or bonded copper posts with a joining solder layer. Solder described here may include lead or may be lead-free.

Figure 1B:
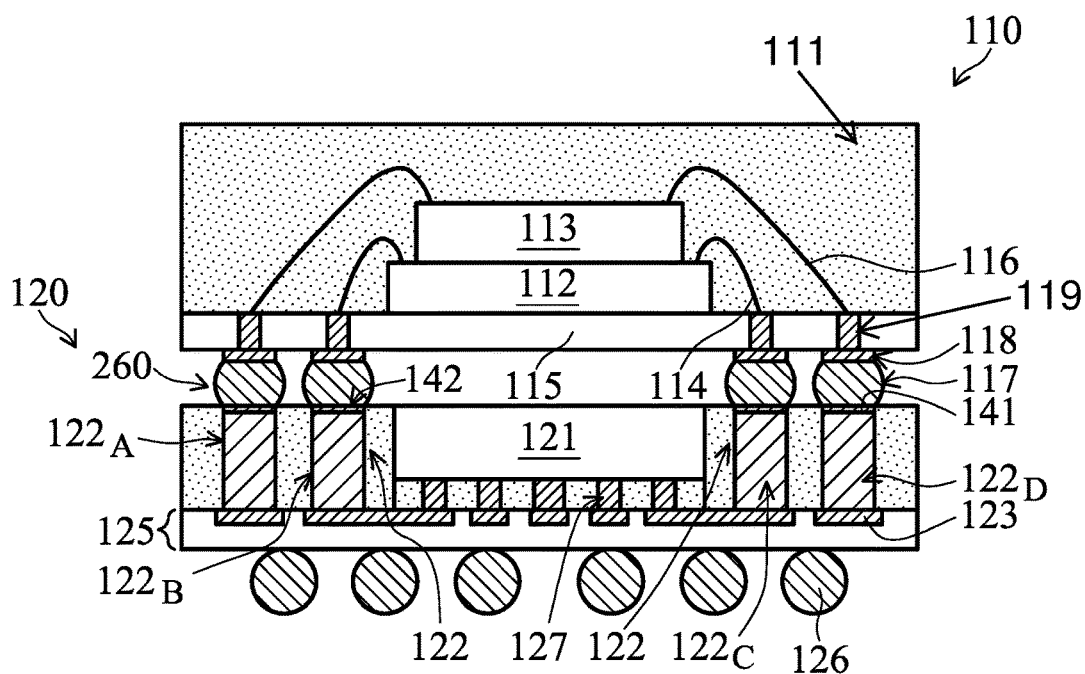
FIG. 1B shows a cross-sectional view of a die package bonded to another die package, in accordance with some embodiments.

FIG. 1B shows a cross-sectional view of a die package 110 over a die package 120, in accordance with some embodiments. As shown in FIG. 1B, package 110 includes two semiconductor dies 112 and 113, with die 113 disposed over die 112. However, package 110 could include one semiconductor die or more than two semiconductor dies. In some embodiments, there is a glue layer (not shown) between dies 112 and 113. Semiconductor dies 112 and 113 may include various microelectronic elements, as described above for semiconductor dies. Semiconductor die 112 is bonded to a substrate 115. Substrate 115 may include various materials and/or components described above for substrate 100. Semiconductor die 112 is electrically connected to conductive elements (not shown) in substrate 115 via bonding wires 114, in accordance with some embodiments. Similarly, semiconductor die 113 is electrically connected to the conductive elements in substrate 115 via bonding wires 116. Package 110 also includes a molding compound 111, which covers semiconductor dies 112 and 113, and also bonding wires 114 and 116. Package 110 also includes a number of connectors 117 for external connections. Connectors 117 are formed on metal pads 118, which are electrically connected to bonding wires 114 and 116 by interconnect structures 119, which may include vias and metal lines.

Die package 120 includes a semiconductor die 121 and TPVs 122, which surround die 121, as shown in FIG. 1B in accordance with some embodiments. Package 120 also includes a redistribution structure 125, which includes one or more redistribution layers (RDLs) 123. Redistribution layers (RDLs) 123 are metal interconnect layers, which may include metal lines and vias, and are surrounded by dielectric material(s). RDL(s) 123 enables fan-out of die 121. External connectors 126, such as ball grid array (BGA), are attached to metal pads (not shown) on redistribution structure 125, as shown in FIG. 1B. As shown in FIG. 1B, TPVs 122 are connected to connectors 117 of package 110. Die 121 and external connectors 126 are on opposite sides of redistribution structure 125. Die 121 is connected to redistribution structure 125 via connectors 127.

Connectors 117 of die package 110 are made of solders, in some embodiments. In some embodiments, connectors 117 include copper posts with solder at the ends of solder posts. The solder of connectors 117 are bonded to exposed copper surface of TPVs 122, which are filled with copper. However, the exposed copper surface could form copper oxide when exposed to atmosphere. As a result, a copper oxide layer 141, as shown in TPV $122_D$ of FIG. 1B, could form on the surface of TPVs 122. Although a flux could be applied on the surface of TPVs 122 to remove the copper oxide layer formed on the surface of TPVs 122, the removal process is non-consistent in some embodiments. As a result, copper oxide layer 141, or at least a portion of copper oxide layer 141, remains on some TPVs 122, such as TPV $122_D$. Solder of connectors 126 does not bond well to copper oxide layer 141; therefore, the joint would be weak, which would affect yield and reliability.

Even if flux does remove the copper oxide layer from TPVs, such as TPVs $122_A$, $122_B$, and $122_C$, the direct contact between solder of connectors 126 and copper of TPVs would result in the formation of intermetallic compound (IMC), such as Cu:Sn. FIG. 1B shows IMC layer 142 formed between solder of connectors 126 and copper of TPVs $122_A$, $122_B$, and $122_C$, in accordance with some embodiments. Due to varying coefficients of thermal expansion (CTEs) of different elements on package 120, package 120 could bow during and/or after packaging process. Such bowing (or warpage) creates stress for the bonding structures, formed by bonded connectors 126 and TPVs 122, between package 120 and package 110. The stress could cause cracking of the bonding structures 260, formed by connectors 117 and TPVs 122, to affect yield and reliability of the package-on-package (PoP) structure.

A protective layer (not shown), such as a solder paste layer, an organic solderability paste layer (OSP), or other applicable protective layer, could be formed over TPVs 122 after they are exposed and before they are bonded to connectors. However, forming such a protective layer after the formation of TPVs 122 could involve transferring the carrier with the packaged dies (or the substrate) to a processing system or chamber and/or processing the substrate to form the protective layer. Prior to forming the protective layer, surfaces of the TPVs 122 would need to be treated, such as by flux, to remove the oxide layer 141 formed. Such additional processing operations could be cost-prohibiting. Consequently, there is a need of mechanisms for forming bonding structures between die packages without the issues described above.

Figure 2A:
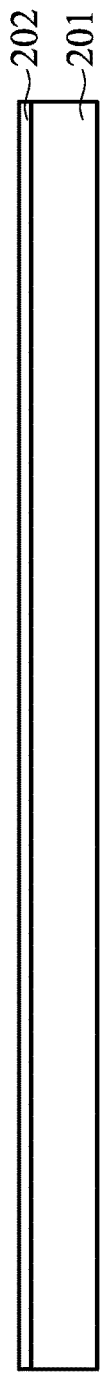
FIGS. 2A-2P show cross-sectional views of a sequential process flow of preparing a package on package (PoP) device, in accordance with some embodiments.
Figure 2B:
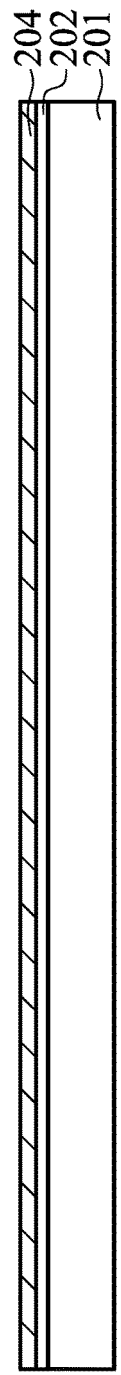
Figure 2C:
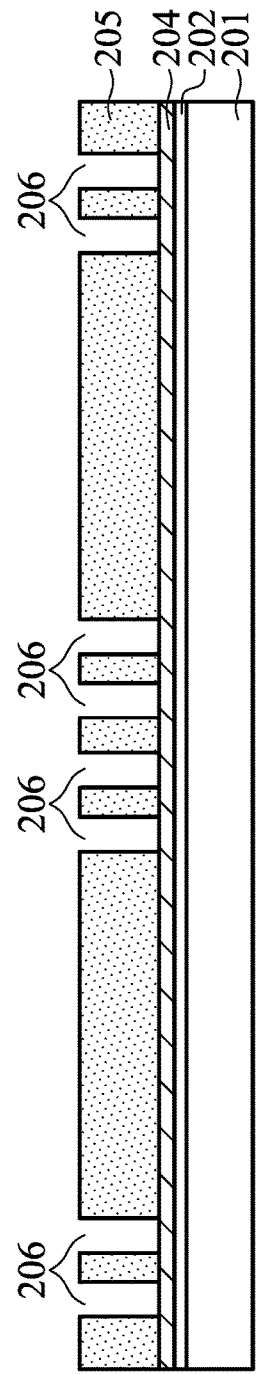
Figure 2H:
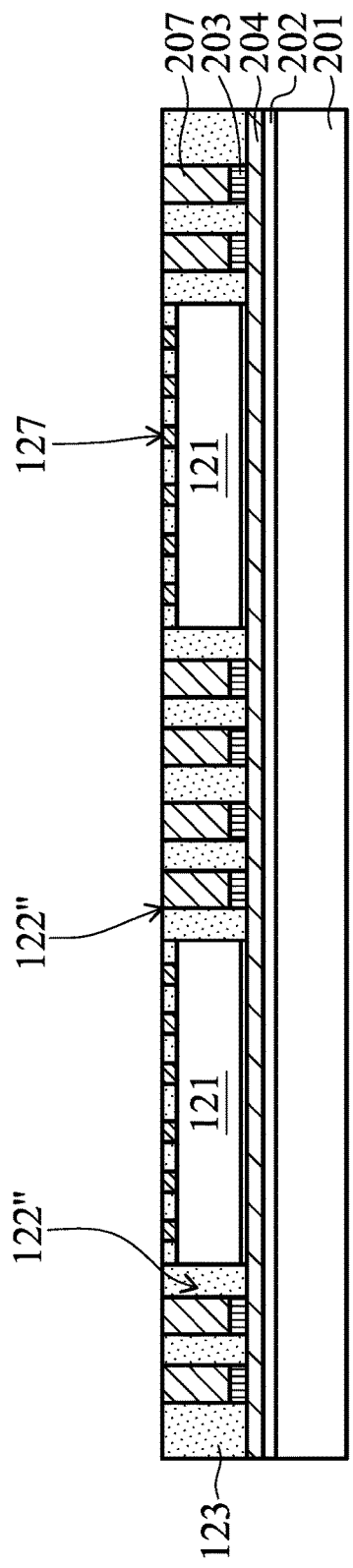
Figure 2I:
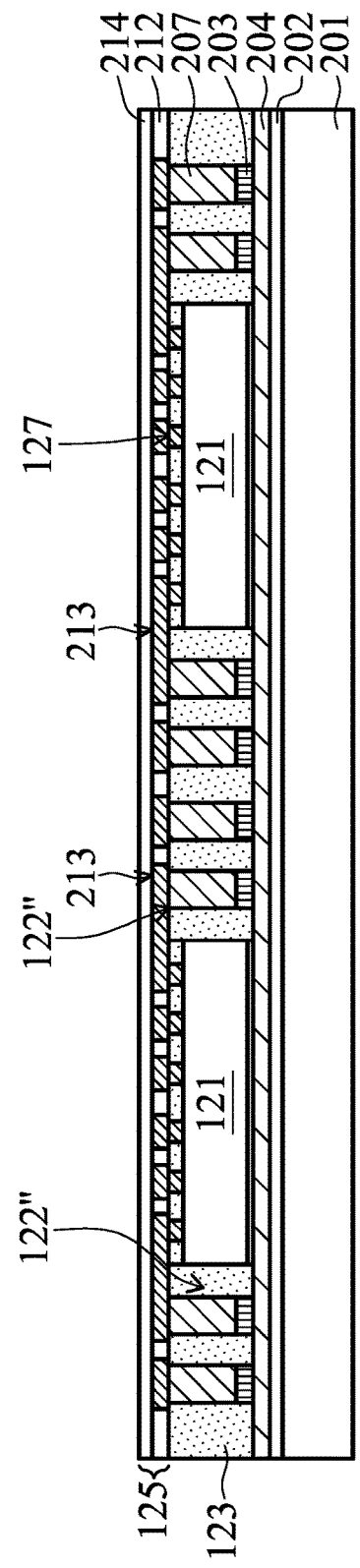
Figure 2N:
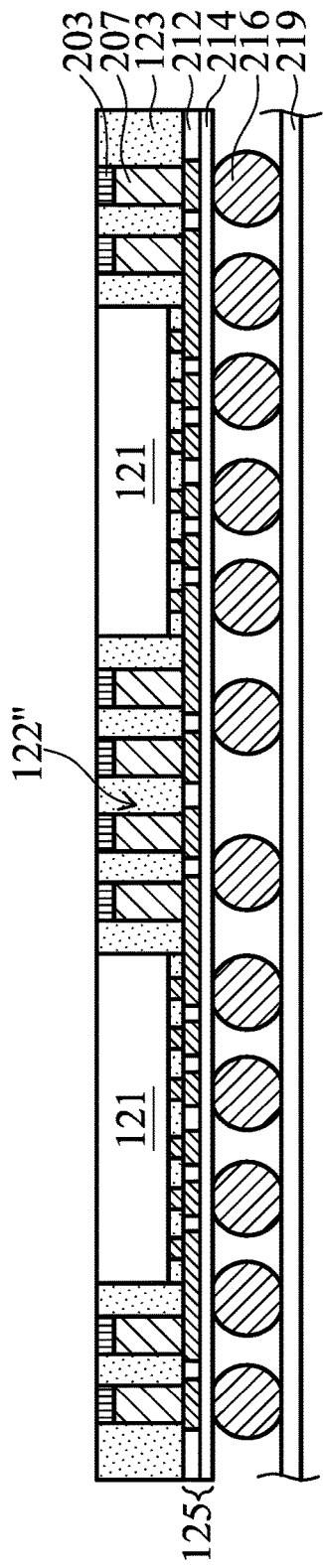
Figure 2O:
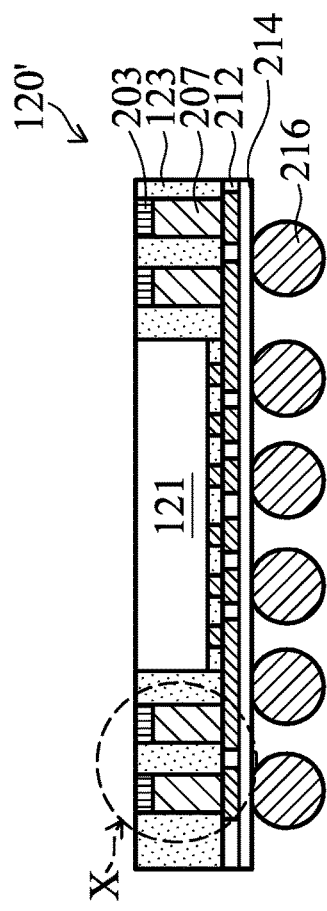
Figure 2P:
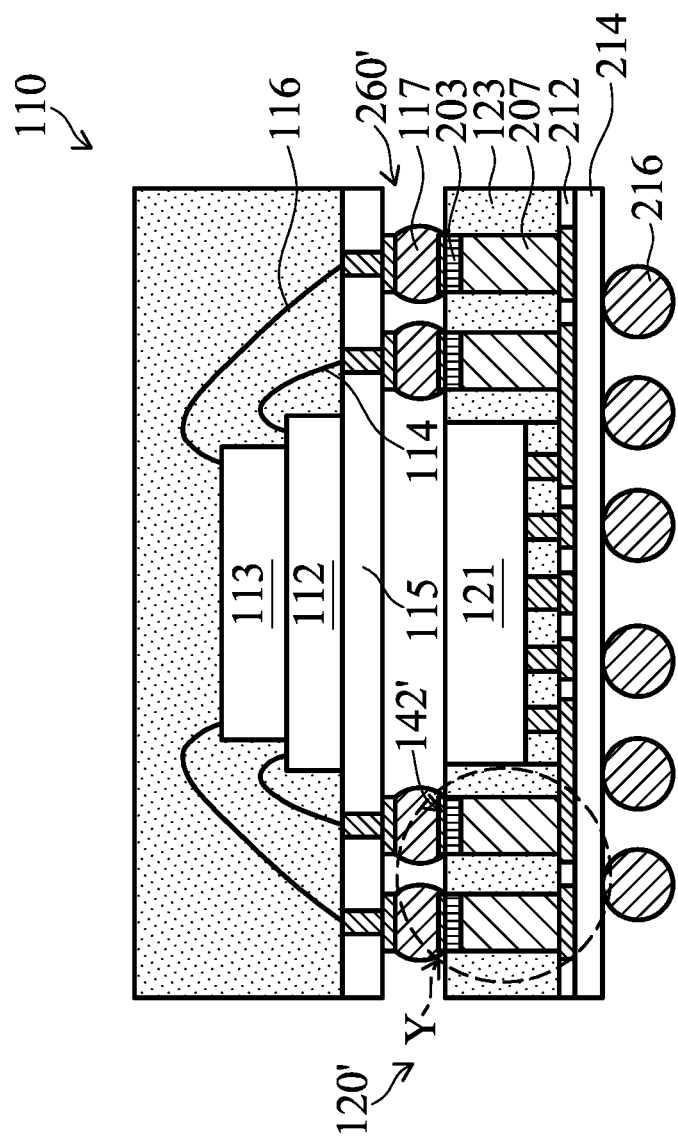

FIGS. 2A-2P show cross-sectional views of a sequential process flow of preparing a package on package (PoP) device, in accordance with some embodiments. FIG. 2A shows an adhesive layer (or glue layer) 202, which is over carrier 201. Carrier 201 is made of glass, in accordance with some embodiments. However, other materials may also be used for carrier 201. Adhesive layer 202 is deposited or laminated over carrier 201, in some embodiments. Adhesive layer 202 may be formed of a glue, or may be a lamination material, such as a foil. In some embodiments, adhesive layer 202 is photosensitive and is easily detached from carrier 201 by shining ultra-violet (UV) light or laser on carrier 201 after the involved packaging process is completed. For example, adhesive layer 202 may be a light-to-heat-conversion (LTHC) coating made by 3M Company of St. Paul, Minnesota. In some other embodiments, the adhesive layer 202 is heat-sensitive. In some embodiments, there is a glue layer (not shown) adhesive layer 202. For example, the glue layer could be a die attach film (DAF), a polymer (such as polyimide or polybenzoxazole (PBO)), or a solder resist to improve adhesion.

A plating seed layer 204 is then formed on the adhesive layer 202, as shown in FIG. 2B in accordance with some embodiments. In some embodiments, the plating seed layer 204 is made of copper and is formed by physical vapor deposition (PVD). However, other conductive film may also be used. For example, the plating seed layer 204 may be made of Ti, Ti alloy, Cu, and/or Cu alloy. The Ti alloy and Cu alloy may include silver, chromium, nickel, tin, gold, tungsten, and combinations thereof. In some embodiments, the thickness of the plating seed layer 204 is in a range from about 0.1 µm to about 1.0 µm. In some embodiments, the plating seed layer 204 includes a diffusion barrier layer, which is formed prior to the deposition of the plating seed layer. The plating seed layer 204 may also act as an adhesion layer to under layer. In some embodiments, the diffusion barrier layer is made of Ti with a thickness in a range from about 0.01 µm to about 0.1 µm. However, the diffusion barrier layer may be made of other materials, such as TaN, or other applicable materials and the thickness range is not limited to the range described above. The diffusion barrier layer is formed by PVD in some embodiments.

Following the deposition of the plating seed layer 204, a photoresist layer 205 is formed over plating seed layer 204, as shown in FIG. 2C in accordance with some embodiments. The photoresist layer 205 may be formed by a wet process, such as a spin-on process, or by a dry process, such as by a dry film. After the photoresist layer 205 is formed, the photoresist layer 205 is patterned to form openings 206, which are filled to form TPVs described above in FIG. 1B. The processes involved include photolithography and resist development. In some embodiments, the width W of openings 206 is in a range from about 40 µm to about 260 µm. In some embodiments, the depth D of openings 206 is in a range from about 60 µm to about 300 µm.

Afterwards, a first conductive layer 203 is plated on the surface of plating seed layer 204, in accordance with some embodiments. The first conductive layer 203 does not form IMC with solder, or forms IMC with solder at a much slower rate than copper. In addition, the first conductive layer 203 is less or much less likely to oxidize than copper when exposed to the environment (e.g., air). In some embodiments, the first conductive layer 203 is made of nickel (Ni). However, other conducting material possessing the quality described above for layer 203, such as platinum (Pt), gold (Au), silver (Ag), Tin (Sn), Sn alloy (including, but are not limited to, SnAg, SnAgCu, SnCu, SnAgCu—Bi), etc., and combinations thereof may also be used. In some embodiments, the thickness of layer 203, $D_1$, is in a range from about 0.1 µm to about 30 µm.

Following the formation of the first conductive layer 203, a second conductive layer 207 is plated over the first conductive layer 203 to fill openings 206, as shown in FIG. 2D in accordance with some embodiments. In some embodiments, the thickness of layer 207, $D_2$, is in a range from about 50 µm to about 300 µm.

Following the plating to gap-fill process, the photoresist layer 205 is removed by an etching process, which may be a dry or a wet process. FIG. 2E shows a cross-sectional view of the structure on carrier 201 after the photoresist layer 205 is removed and conductive material in the openings 206 is exposed as (conductive) columns 122', in accordance with some embodiments.

Afterwards, semiconductor die 121 is attached to a surface 209 over carrier 201 by a glue layer 210, as shown in FIG. 2F in accordance with some embodiments. Glue layer 210 is made of a die attach film (DAF), in accordance with some embodiments. DAF may be made of epoxy resin, phenol resin, acrylic rubber, silica filler, or a combination thereof. FIG. 2F show that connectors 127 of die 121 are facing away from the surface 209. A liquid molding compound material is then applied on the surface of plating seed layer 204 over carrier 201 to fill the space between conductive columns 122' and die 121 and to cover die 121 and conductive columns 122'. In some embodiments, semiconductor die 121 is attached directly on the surface of layer 202. Layer 204 under die 121 is first removed. Under such circumstance, the molding compound is applied on the surface of layer 202. A thermal process is then applied to harden the molding compound material and to transform it into molding compound 123. Conductive columns 122' become TPVs 122" after the molding compound 123 is formed to surround them.

Afterwards, a planarization process is applied to remove excess molding compound 123 to expose TPVs 122" and connectors 127 of die 121, as shown in FIG. 2G in accordance with some embodiments. In some embodiments, the planarization process is a grinding process. In some other embodiments, the planarization process is a chemical-mechanical polishing (CMP) process. The post planarization structure is shown in FIG. 2H in accordance with some embodiments.

Following the planarization process, redistribution structure 125 is formed over surface 211 over structure of FIG. 2H, as shown in FIG. 2I in accordance with some embodiments. FIG. 2I shows that the second redistribution structure 125 include RDLs 213, which are insulated by one or more passivation layers, such as layer 212 and 214. RDLs 213 may include metal lines and conductive vias. The RDLs 213 are made of a conductive material and directly contact TPVs 122" and connectors 127 of die 121. In some embodiments, the RDLs 213 are made of aluminum, aluminum alloy, copper, or copper-alloy. However, RDLs 213 may be made of other types of conductive materials. The passivation layers 212 and 214 are made of dielectric material(s) and provide stress relief for bonding stress incurred during bonding external connectors 126 with substrate 130. In some embodiments, the passivation layers 212 and 214 are made of polymers, such as polyimide, polybenzoxazole (PBO), or benzocyclobutene (BCB). Passivation 214 is patterned to form openings (not shown) to expose portions of RDLs 123 to form bond pads (not shown). In some embodiments, an under bump metallurgy (UBM) layer (not shown) is formed over bond pads. The UBM layer may also line the sidewalls of openings of passivation layer 214. The RDLs 213 may be a single layer, in some embodiments.

Examples of redistribution structures and bonding structures, and methods of forming them are described in U.S. application Ser. No. 13/427,753, entitled "Bump Structures for Multi-Chip Packaging," filed on Mar. 22, 2012, and U.S. application Ser. No. 13/338,820, entitled "Packaged Semiconductor Device and Method of Packaging the Semiconductor Device," filed on Dec. 28, 2011. Both above-mentioned applications are incorporated herein by reference in their entireties.

After the redistribution structure 125 is formed, external connectors 126 are mounted on (or bonded to) bond pads (not shown) of redistribution structure 125, as shown in FIG. 2J in accordance with some embodiments. The dies on carrier 201 are electrically tested to check for the functionality of dies and also for the quality of the formation of the TPVs 122", the redistribution structure 125 and bonded external connectors 126. In some embodiments, reliability test is also performed.

After external connectors 126 are mounted on bond pads, the structure in FIG. 2J is flipped and is attached to a tape 219, as shown in FIG. 2K in accordance with some embodiments. Tape 219 is photosensitive and is easily detached from carrier 201 by shining ultra-violet (UV) light on carrier 201 after the involved packaging process is completed in accordance with some embodiments. Afterwards, carrier 201 and adhesive layer 202 are removed. Laser could be used to provide heat to remove the adhesive layer. FIG. 2L shows the structure after carrier 201 and adhesive layer 202 are removed. Following the removal of the adhesive layer 202, the plating seed layer 204 is removed, as shown in FIG. 2M in accordance with some embodiments. The plating seed layer 204 is removed by etching, such as by a wet etch. To remove copper, an aqueous solution with phosphoric acid ($H_3PO_4$) and hydrogen peroxide ($H_2O_2$) may be used. If the plating seed layer 204 includes a diffusion barrier layer, such as a Ti layer, an aqueous solution of HF can be used. In some embodiments, a portion of first conductive layer 203 is removed to form a recess (not shown) in each TPV 122".

Following the removal of the plating seed layer 204, glue layer 210 is removed as shown in FIG. 2N, in accordance with some embodiments. As mentioned above, glue layer 210 may be made of a die attach film (DAF), which could be removed by a wet stripping process containing tetramethylammonium hydroxide (TMAH) and dimethyl sulfoxide (DMSO). In some embodiments, the glue layer 210 is not removed and stays to assist in dissipating heat generated by die 121.

Whether the glue layer 210 is removed or not (depending the requirement), the packaged die is then singulated into individual packaged dies. The singulation is accomplished by die saw. After singulation is completed, tape 219 is removed from the packaged dies. FIG. 2O shows a packaged die 120' following the removal of tape 210, in accordance with some embodiments. Region X in FIG. 2O includes two TPVs 122 in the illustrated example.

A die package 110 is then placed over die package 120'. External connectors 117 of die package 110 are bonded to TPVs 122" of die package 120', as shown in FIG. 2P in accordance with some embodiments. Due to the insertion of the first conductive layer 203, the bonding structures 260' formed by connectors 117 and TPVs 122" have a thinner IMC layer 142', which is formed by solder from connectors 117 and a conductive material, such as Ni. The IMC, such as Ni:Sn, is formed at a rate slower than IMC of solder and copper (Cu:Sn). Region Y in FIG. 2P shows bonding structures 260' and IMC layer 142'.

Figure 3A:
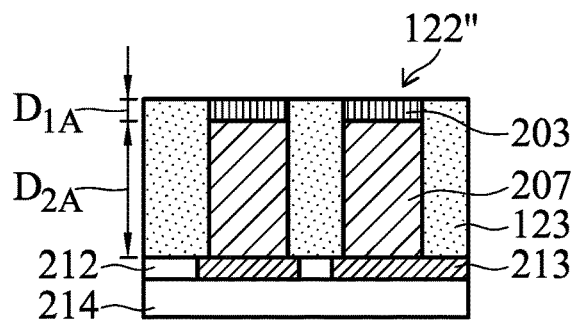
FIGS. 3A-8C are cross-sectional views of die packages and package-on-package (PoP) devices, in accordance with some embodiments.
Figure 3B:
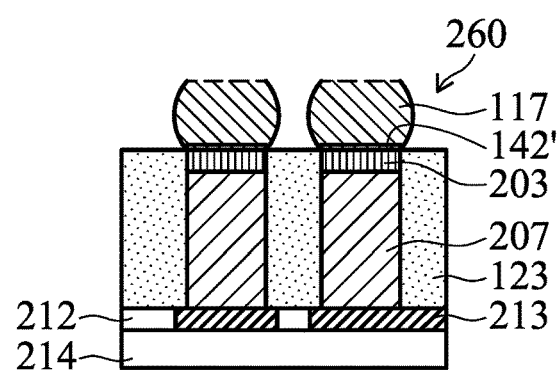

FIG. 3A shows an enlarged view of region X of FIG. 2O, in accordance with some embodiments. Region X includes TPVs 122", which are surrounded by molding compound 123. TPVs 122" are connected to RDL 213, which is insulated by passivation layers 212 and 214. Each of TPVs 122" has a first conductive layer 203 with a height $D_{1A}$ and a second conductive layer 207 with a height $D_{2A}$. $D_{1A}$ is in a range from about 0.5 µm to about 10 µm, in some embodiments. $D_{2A}$ is in a range from about 50 µm to about 300 µm, in some embodiments. FIG. 3B shows an enlarged view of region Y of FIG. 2Q, in accordance with some embodiments. FIG. 3B shows that an IMC layer 142' is formed between Sn of solder and the first conductive layer 203. For example, if the first conductive layer 203 is made of Ni, a Ni:Sn-containing IMC is formed. In some embodiments, the thickness of IMC layer 142' is in a range from about 0.5 µm to about 10 µm, in some embodiments. IMC layer 142' is much thinner than IMC layer 142 (containing Cu:Sn) described in FIG. 1B. Therefore, the first conductive layer 203 acts as a protective layer of the second (or main) conductive layer 207 of TPVs 122".

Further, because the first conductive layer 203 is less likely or very unlikely to oxidize, the risk of forming an interfacial oxide layer similar to oxide layer 141 of FIG. 1B is greatly reduced, in many cases reduced to none. If a flux pre-treatment prior to bonding with connectors 117 is used, it would remove the surface oxide layer, if any, more consistently. As a result, the bonding structures 260 formed between die packages 110 and 120' are much stronger than the bonding structures without the first conductive layer 203.

The first conductive layer 203 can be formed in an integrated plating system for forming the second conductive layer 207. The additional cost of forming the first conductive layer 203 is more reasonable and manufacturing-worth.

Figure 4A:
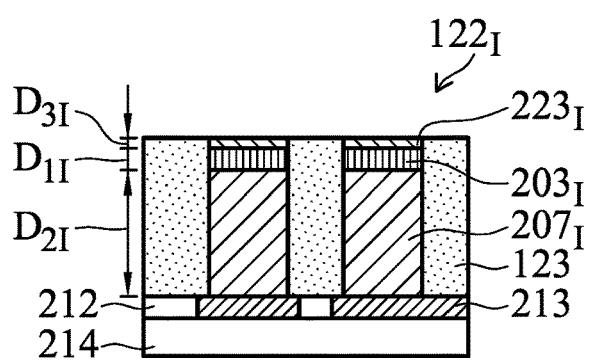
Figure 4B:
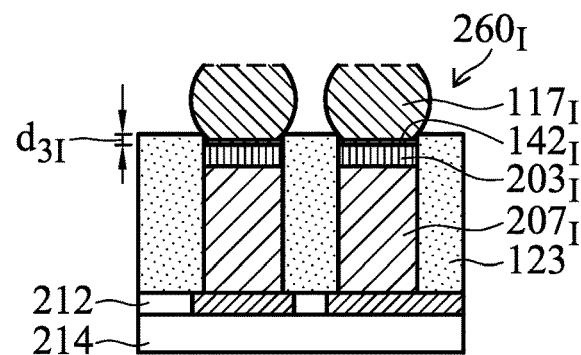

The concept of forming a protective conductive layer, such as layer 203, as part of TPVs to reduce surface oxidation of TPVs and to reduce the amount of IMC formed described above may be expanded to include other types of embodiments. FIG. 4A shows TPVs $122_I$, in accordance with some embodiments. FIG. 4A shows that a third conductive layer $223_I$ is formed next to the first conductive layer $203_I$, which is formed next to the second conductive layer $207_I$. In the process flow described above, the third conductive layer $223_I$ is plated over plating seed layer 204 prior to the plating of the first conductive layer $203_I$. FIG. 4B shows TPVs $122_I$ bonded to connectors 117 to form bonding structures $260_I$, in accordance with some embodiments.

The third conductive layer $223_I$ is made of solder. Having a solder layer (layer $223_I$) in TPVs $122_I$ enables formation of bonded solder of bonding structures $260_I$ to extend below the surface of molding compound 123, which moves the IMC layer $142_I$ from near surfaces of TPVs $122_I$ to below the surface of TPVs $122_I$. Moving the IMC layer $142_I$ below the surfaces TPVs $122_I$ strengthens the bonding structures $260_I$. The thicknesses of first conductive layer, $D_{1I}$, the thickness of second conductive layer, $D_{2I}$, and the thickness of the IMC layer $142_I$ are similar to those described in FIGS. 3A and 3B, in accordance with some embodiments. The thickness of third conductive layer $D_{3I}$ is in a range from about 0.5 µm to about 30 µm, in some embodiments. The depth, $d_{3I}$, of joint solder $117_I$ of FIG. 4B is below the surface of molding compound 123 in a range from about 0.5 µm to about 30 µm, in some embodiments. $d_{3I}$ is about the same as $D_{3I}$.

Figure 5A:
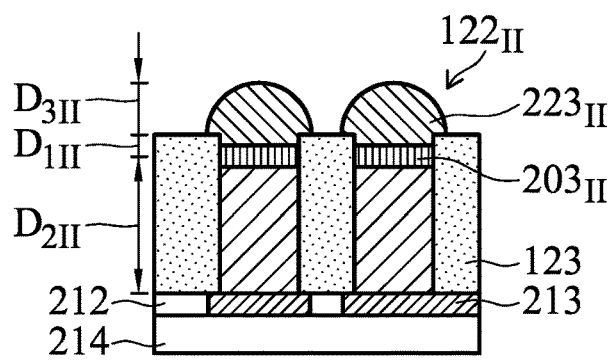
Figure 5B:
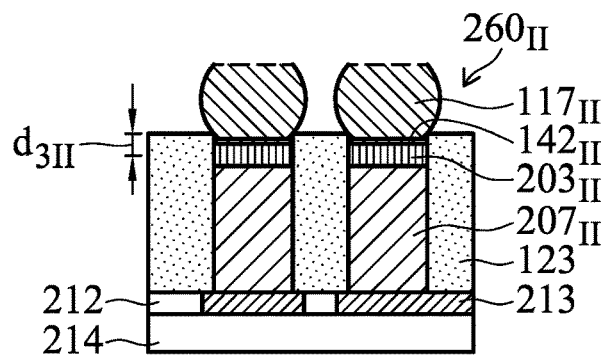

FIG. 5A shows TPVs $122_{II}$, in accordance with some embodiments. FIG. 5A shows that a third conductive layer $223_{II}$ is formed over the first conductive layer $203_{II}$. As described above in FIG. 2M, a portion of first conductive layer is removed to form a recess (not shown) in each TPV. If the structure of FIG. 3A is used to form the structure of FIG. 5A, an etch chemistry for removing the first conductive layer $203_{II}$, such as Ni, is used to form the recess. If the structure of FIG. 4A is used to form the structure of FIG. 5A, an etch chemistry for removing solder is used to form the recess. The third conductive layer $223_{II}$, such as a solder paste, is applied to fill the recess. As shown in FIG. 5A, some of the third conductive layer $223_{II}$ protrudes above TPVs $122_{II}$. FIG. 5B shows TPVs $122_{II}$ bonded to connectors 117 to form bonding structures $260_{II}$, in accordance with some embodiments.

The third conductive layer $223_{II}$ is made of solder. Similar to the structures of FIGS. 4A and 4B, having a solder layer (layer $223_{II}$) in TPVs $122_{II}$ enables formation of bonded solder of bonding structures $260_{II}$ to extended below the surface of molding compound 123, which moves the IMC layer $142_{II}$ from near surfaces of TPVs $122_{II}$ to below the surface of TPVs $122_{II}$. The thicknesses of first conductive layer, $D1_{II}$, the thickness of second conductive layer, $D2_{II}$, and the thickness of the IMC layer $142_{II}$ are similar to those described in FIGS. 3A and 3B, in accordance with some embodiments. The thickness of third conductive layer $D3_{II}$ is in a range from about 0.5 µm to about 30 µm, in some embodiments. The height of recess portion $H_{II}$ is in a range from about 0.5 µm to about 30 µm, in some embodiments. The depth, $d_{3II}$, of joint solder $117_{II}$ of FIG. 5B is below the surface of molding compound 123 in a range from about 0.5 µm to about 30 µm, in some embodiments.

Figure 6A:
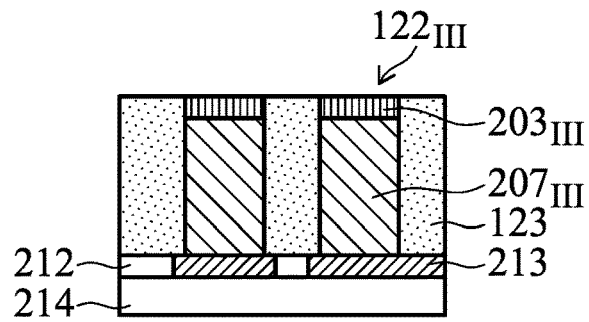
Figure 6B:
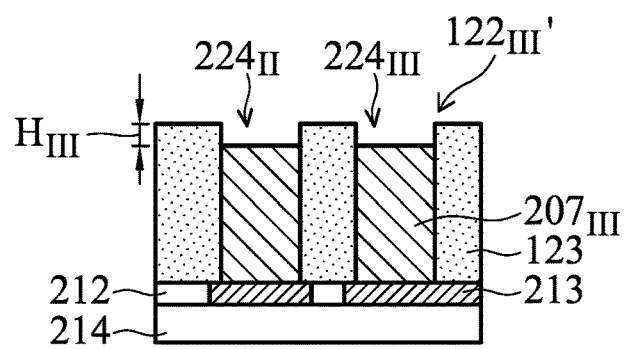

FIG. 6A shows TPVs $122_{III}$, in accordance with some embodiments. TPVs $122_{III}$ are similar to TPVs 122" of FIG. 3A. However, the second conductive layer $207_{III}$ is made of solder, not copper, and the first conductive layer $203_{III}$ is made of Cu or Ti. Solder is cheaper than copper and has good conductivity. Manufacturing cost can be reduced by using solder as the second conductive layer. First conductive layer $203_{III}$, made of Cu or Ti, is removed by etching during the removal of plating seed layer 204, as described above in FIG. 2M. The chemistry used to etch plating seed layer 204 can be used to remove the first conductive layer $203_{III}$. FIG. 6B shows TPVs $122_{III}'$ after the first conductive layer $203_{III}$ is removed, in accordance with some embodiments. Recesses $224_{III}$ are formed. The height $H_{III}$ of recesses $224_{III}$ is in a range from about 0.5 µm to about 30 µm, in some embodiments.

Figure 6C:
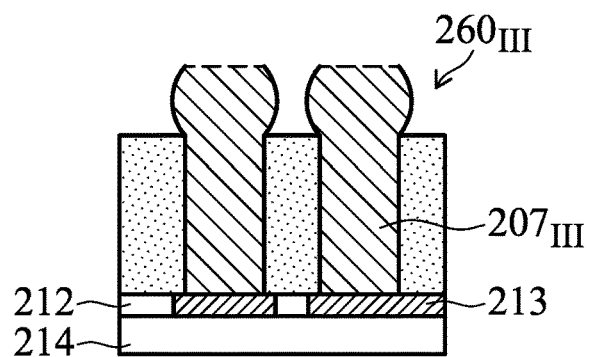

TPVs $122_{III}'$ are bonded to connectors 117 to form bonding structures $260_{III}$, as shown in FIG. 6C in accordance with some embodiments. Solder from connectors 117 fills the recess near the surface of TPVs $122_{III}'$.

Figure 7A:
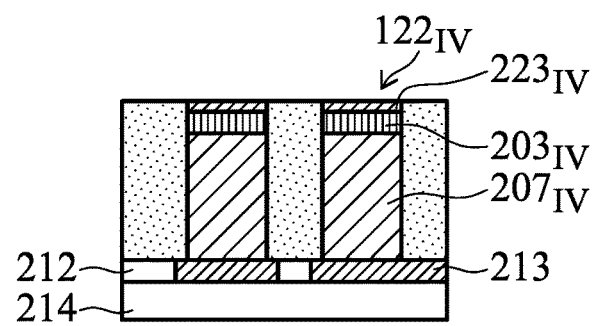
Figure 7B:
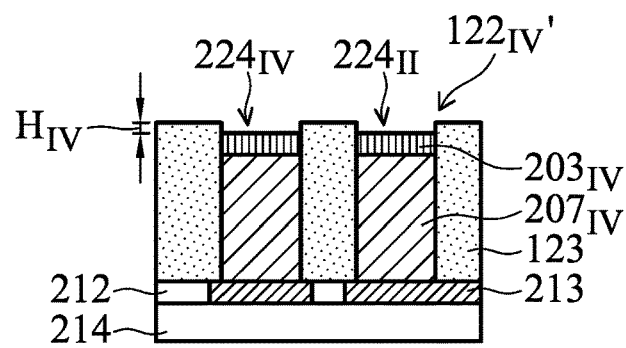

FIG. 7A shows TPVs $122_{IV}$, in accordance with some embodiments. TPVs $122_{IV}$ are similar to TPVs $122_{I}$ of FIG. 4A. First conductive layer $203_{IV}$ is similar to first conductive layer $203_{I}$. Second conductive layer $207_{IV}$ is similar to second conductive layer $207_{I}$. However, the third conductive layer $223_{IV}$ is made of copper or Ti, not solder. The third conductive layer $223_{IV}$, made of Cu or Ti, is removed by etching during the removal of plating seed layer 204, as described above for FIG. 2M. The chemistry used to etch plating seed layer 204 can be used to remove the first conductive layer $203_{IV}$. FIG. 7B shows TPVs $122_{IV}'$ after the third conductive layer $223_{IV}$ is removed, in accordance with some embodiments. In some embodiments, a thin layer of third conductive layer $223_{IV}$ remains over $203_{IV}$. Recesses $224_{IV}$ are formed after the complete or partial removal of third conductive layer $223_{IV}$. The height $H_{IV}$ of recesses $224_{IV}$ is in a range from about 0.5 µm to about 30 µm, in some embodiments.

Figure 7C:
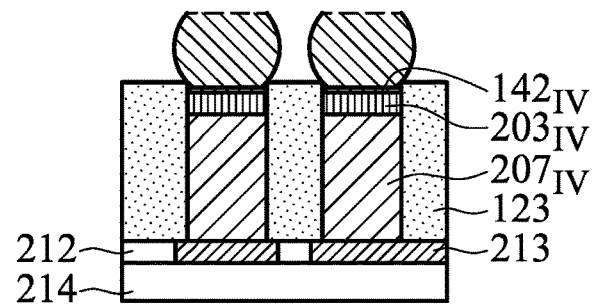

TPVs $122_{IV}'$ are bonded to connectors 117 to form bonding structures $260_{IV}$, as shown in FIG. 7C in accordance with some embodiments. Solder from connectors 117 fills the recess near the surface of TPVs $122_{IV}'$. If a thin layer of third conductive layer $223_{IV}$ remains in TPVs $122_{IV}'$ and is oxidized, the oxidized layer may be removed by an etch process, by flux, or dissolve in solder after bonding. FIG. 7C shows that an IMC layer $142_{IV}$ is formed between the first conductive layer $203_{IV}$ and solder of connectors 117, in accordance with some embodiments. The thickness range of IMC layer $142_{IV}$ is similar to IMC layer 142' of FIG. 3B.

Figure 8A:
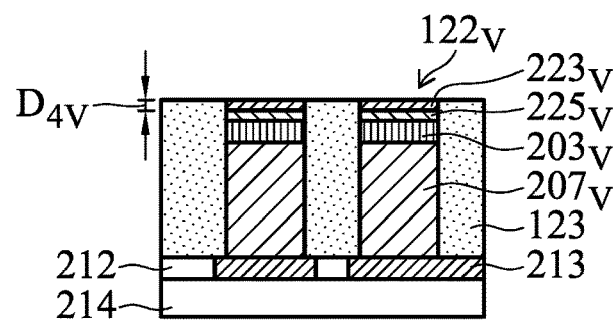

FIG. 8A shows TPVs $122_{V}$, in accordance with some embodiments. TPVs $122_{V}$ are similar to TPVs $122_{IV}$ of FIG. 7A. Third conductive layer $223_{V}$ is similar to third conductive layer $223_{IV}$. First conductive layer $203_{V}$ is similar to first conductive layer $203_{IV}$. Second conductive layer $207_{V}$ is similar to second conductive layer $207_{IV}$. However, a fourth conductive layer $225_{V}$ is formed between the first conductive layer $223_{V}$ and the third conductive layer $203_{V}$, as shown in FIG. 8A. As mentioned above, the third conductive layer $223_{V}$ is made of Cu or Ti. The fourth conductive layer $225_{V}$ is made of solder. The thickness $D_{4V}$ of fourth conductive layer $225_{V}$ is in a range from about 0.3 µm to about 2 µm, in some embodiments.

Figure 8B:
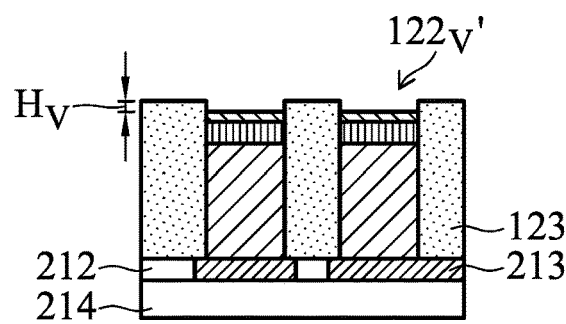

The third conductive layer $223_{V}$, made of Cu or Ti, is removed by etching during the removal of plating seed layer 204 as described above. FIG. 8B shows TPVs $122_{V}'$ after the third conductive layer $223_{V}$ is removed, in accordance with some embodiments. Recesses $224_{V}$ are formed. The height $H_{V}$ of recesses $224_{V}$ is in a range from about 0.3 µm to about 2 µm, in some embodiments.

Figure 8C:
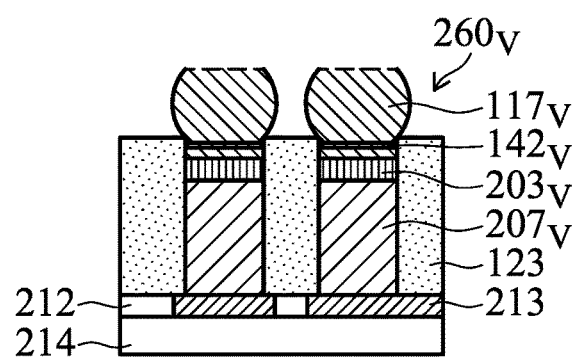

TPVs $122_{V}'$ are bonded to connectors $117_{V}$ to form bonding structures $260_{V}$, as shown in FIG. 8C in accordance with some embodiments. Solder from connectors 117 fills the recess near the surface of TPVs $122_{V}'$. FIG. 8C shows that an IMC layer $142_{V}$ is formed between the first conductive layer $203_{V}$ and solder of connectors $117_{V}$, in accordance with some embodiments. The thickness range of IMC layer $142_{V}$ is similar to IMC layer 142' of FIG. 3B.

The additional conductive layers in the TPVs described above are formed by one or more plating processes prior to the main conductive layer. The different plating processes may be performed in an integrated system. The additional manufacturing cost is limited. The recesses at the ends of the TPVs described are formed by additional etching during the removal of plating seed layer. If the conductive layer removed to form the recesses is made of Cu or Ti, the etch process is just an extension of the plating seed layer removal process. It could just involve additional etch time. If the conductive layer removed is not Cu or Ti, a different etching process is involved. However, the etching to form recesses and the etching to remove the plating seed layer may be performed in an integrated system. The cost of manufacturing related to forming recess is also limited. However, the protective layer of the additional conductive layers, which is less likely to oxidize and less likely to form IMC with solder, improves yield and reliability of bonding structures formed between die package. The recesses also improve yield and reliability of bonding structures formed between die packages.

Various embodiments of mechanisms for forming through package vias (TPVs) with multiple conductive layers and/or recesses in a die package and a package on package (PoP) device with bonding structures utilizing the TPVs are provided. One of the multiple conductive layers acts as a protective layer of the main conductive layer of the TPVs. The protective layer is less likely to oxidize and also has a slower formation rate of intermetallic compound (IMC) when exposed to solder. The recesses in TPVs of a die package are filled by solder from the other die package and the IMC layer formed is below the surface of TPVs, which strengthen the bonding structures.

In some embodiments, a semiconductor die package is provided. The semiconductor die package includes a semiconductor die, and a through package via (TPV) formed in the semiconductor die package. The TPV is disposed next to the semiconductor die, and the TPV include a first conductive layer and a second conductive layer. The first conductive layer fills a first section of the TPV and the second conductive layer fills a second section of the TPV. The semiconductor die package also includes a redistribution structure, and the redistribution structure includes a redistribution layer (RDL). The TPV and the semiconductor die are electrically connected to the RDL and the RDL enables fan-out of the semiconductor die.

In some embodiments, a semiconductor die package is provided. The semiconductor die package includes a semiconductor die, and a through package via (TPV) formed in the semiconductor die package. The TPV is disposed next to the semiconductor die, wherein the TPV include a conductive layer and a recess. The semiconductor die package also includes a redistribution structure, and the redistribution structure includes a redistribution layer (RDL). The TPV and the semiconductor die are electrically connected to the RDL and the RDL enables fan-out of the semiconductor die. The recess is on the opposite side of the conductive layer from the RDL.

In yet some other embodiments, a package-on-package (PoP) device is provided. The PoP device includes a first die package. The first die package includes a first semiconductor die, and a through package via (TPV). The TPV is disposed next to the semiconductor die, and the TPV includes a first conductive layer and a second conductive layer. The PoP device also includes a second die package. The second die package includes a second semiconductor die, and an external connector containing solder. The external connector of the second die package is bonded to the TPV of the first die package.

In embodiments, a method includes forming a seed layer over a carrier substrate, and forming a patterned sacrificial layer over the seed layer. The patterned sacrificial layer includes an opening exposing a portion of the seed layer, and the opening has a substantially uniform diameter from its topmost edge to its bottommost edge. The method further includes forming a through via having a substantially planar topmost surface and a substantially planar bottommost surface by plating a first conductive layer on the seed layer within the opening and plating a second conductive layer within the opening and on the first conductive layer. The patterned sacrificial layer is removed, and an integrated circuit die is mounted over the carrier substrate. The integrated circuit die and the through via are encapsulated in a molding compound, and a portion of the molding compound is removed to expose a top surface of the integrated circuit die and a top surface of the through via. The method further includes forming a redistribution structure over the integrated circuit die, the through via, and the molding compound, the redistribution structure electrically contacting the topmost surface of the through via and electrically contacting a contact pad on the top surface of the integrated circuit die. The carrier substrate is removed to expose the bottommost surface of the through via.

In other embodiments, a method includes forming a bottom die package which includes forming a seed layer over a carrier substrate and forming a photoresist layer over the seed layer. An opening is formed in the photoresist layer, wherein the opening exposes a portion of the seed layer. A through package via is formed, wherein forming the through package via includes forming a first conductive layer within the opening, forming a second conductive layer within the opening and on the first conductive layer, and removing the photoresist layer. An integrated circuit die is mounted on the seed layer, the integrated circuit die having a connector on a top surface thereof. The integrated circuit die and the through package via are encapsulated in a molding compound and a portion of the molding compound is removed to expose the connector of the integrated circuit die and a topmost surface of the through package via. A redistribution structure is formed over the carrier substrate, the redistribution structure electrically contacting the connector of the integrated circuit die and the topmost surface of the through package via. The carrier substrate and the seed layer are removed to expose a bottommost surface of the through package via. The method further includes attaching a top die package to the bottom die package, wherein the top die package is connected to the bottommost surface of the through package via.

In some embodiments, a method includes forming a first die package. Forming the first die package includes forming a photoresist layer over a substrate and patterning the photoresist layer to form an opening extending through the photoresist layer. It further includes forming a through via in the opening, wherein forming the through via includes forming a first conductive layer of a first material within the opening and forming a second conductive layer of a second material, different from the first material, within the opening and on the first conductive layer. The photoresist layer is removed, and an integrated circuit die is mounted on the substrate. The integrated circuit die has a contact pad on a top surface thereof. The integrated circuit die and the through via are encapsulated in a molding compound, and the molding compound is planaraized to expose the contact pad of the integrated circuit die and the through via. A redistribution structure is formed over the molding compound, the through via, and the integrated circuit die, wherein the redistribution structure electrically contacts the contact pad of the integrated circuit die and a topmost surface of the through via. The substrate is removed to expose a bottommost surface of the through via. The method further includes attaching a second die package to the first die package, wherein the second die package is connected by an external connector to the bottommost surface of the through via.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a first die package, wherein the first die package comprises:
        a first semiconductor die having a first surface and a second surface opposite the first surface, the first surface comprising a die connector, the first semiconductor die being laterally encapsulated in a molding compound, the first surface being level with a third surface of the molding compound, the second surface being level with a fourth surface of the molding compound; and
        a through package via (TPV) extending through the molding compound, the TPV comprising a first conductive layer and a second conductive layer, the first conductive layer contacting the fourth surface of the molding compound at a first side, the first conductive layer contacting the fourth surface of the molding compound at a second side, the first conductive layer being planar across a surface extending from the first side to the second side, the TPV having a first end that is level with the third surface of the molding compound and has a second end that is level with the fourth surface of the molding compound; and a redistribution structure including a redistribution layer that physically and electrically contacts both the TPV and the die connector of the first semiconductor die in a common plane, the common plane being parallel to the first surface of the first semiconductor die.

2. The device of claim 1, wherein the first conductive layer and the second conductive layer have a same diameter.

3. The device of claim 1 further comprising:
a second die package comprising:
a second semiconductor die, and
an external connector containing solder, the external connector of the second die package being bonded to the TPV of the first die package.

4. The device of claim 3, wherein the external connector of the second die package is bonded to the first conductive layer of the TPV.

5. The device of claim 3, wherein an intermetallic compound (IMC) is between the external connector and the first conductive layer, wherein the IMC has a thickness in a range from about 0.5 µm to about 10 µm.

6. The device of claim 1, wherein the first conductive layer is made of a metal selected from a group consisting of Ni, Pt, Sn, and Sn alloy, wherein the Sn alloy contains Ag, Cu, Bi, and combinations thereof.

7. The device of claim 1, wherein the second conductive layer is made of copper.

8. The device of claim 1, wherein the first conductive layer has a thickness in a range from 0.1 µm to 30 µm.

9. The device of claim 1, wherein the second conductive layer has a thickness in a range from 50 µm to 300 µm.

10. A structure comprising:
a first die package comprising:
a semiconductor die, the semiconductor die having a top surface and having a die connector on a bottom surface;
a molding compound at least laterally encapsulating the semiconductor die, the molding compound having a top surface and a bottom surface, the top surface of the molding compound being level with the top surface of the semiconductor die; and
a through package via (TPV) in the molding compound, the TPV comprising a first conductive layer over a second conductive layer, the second conductive layer of the TPV having a bottom surface that is level with the bottom surface of the molding compound, the top surface of the molding compound being higher than a topmost surface of the first conductive layer, the TPV having a substantially uniform diameter from the bottom surface of the second conductive layer to the topmost surface of the first conductive layer;
a redistribution structure comprising a redistribution layer (RDL) coupled to semiconductor die and the bottom surface of the TPV; and
a second die package comprising:
a second semiconductor die; and
a conductive connector containing solder, the conductive connector of the second die package being bonded to the first conductive layer of the TPV of the first die package, the conductive connector extending below the top surface of the molding compound of the first die package.

11. The structure of claim 10, wherein the bottom surface of the TPV is physically connected to the RDL in a first plane, the first plane being parallel to the bottom surface of the semiconductor die and wherein the semiconductor die is also physically connected to the RDL in the first plane.

12. The structure of claim 10, wherein an intermetallic compound (IMC) is between the conductive connector and the first conductive layer, the IMC having a bottom surface lower than the top surface of the molding compound.

13. The structure of claim 10, wherein the first conductive layer is made of a metal selected from a group consisting of Ni, Pt, Sn, and Sn alloy, wherein the Sn alloy contains Ag, Cu, Bi, and combinations thereof.

14. The structure of claim 10, wherein the second conductive layer is made of copper.

15. The structure of claim 10, wherein the top surface of the molding compound is higher than the topmost surface of the first conductive layer by a first distance, the first distance being in a range from 0.5 µm to 30 µm.

16. The structure of claim 10, wherein the first conductive layer is a different material than the second conductive layer.

17. A structure comprising:
a first package comprising:
a semiconductor die;
a molding compound encapsulating the semiconductor die, the molding compound having a top surface and a bottom surface, the top surface of the molding compound being level with a surface of the semiconductor die; and
a through package via (TPV) in the molding compound, the TPV comprising a first conductive layer over a second conductive layer, the second conductive layer of the TPV having a bottom surface that is level with the bottom surface of the molding compound, the top surface of the molding compound being higher than a topmost surface of the first conductive layer, the TPV having a substantially uniform diameter from the bottom surface of the second conductive layer to the topmost surface of the first conductive layer;
a redistribution structure comprising a redistribution layer (RDL) coupled to semiconductor die and the bottom surface of the TPV; and
a second package comprising:
a second semiconductor die; and
a conductive connector containing solder, the conductive connector of the second package being bonded to the first conductive layer of the TPV of the first package, the conductive connector extending below the top surface of the molding compound of the first package, wherein an intermetallic compound (IMC) is between the conductive connector and the first conductive layer, the IMC having a bottom surface lower than the top surface of the molding compound.

18. The structure of claim 17, wherein the second conductive layer has a thickness in a range from 50 µm to 300 µm.

19. The structure of claim 17, wherein the first conductive layer is made of a metal selected from a group consisting of Ni, Pt, Sn, and Sn alloy, wherein the Sn alloy contains Ag, Cu, Bi, and combinations thereof, and wherein the second conductive layer is made of copper.

20. The structure of claim 17, wherein the top surface of the molding compound is higher than the topmost surface of the first conductive layer by a first distance, the first distance being in a range from 0.5 µm to 30 µm.

* * * * *